(12) United States Patent
Lee

(10) Patent No.: US 6,714,885 B1
(45) Date of Patent: Mar. 30, 2004

(54) METHOD FOR MEASURING NUMBER OF YIELD LOSS CHIPS AND NUMBER OF POOR CHIPS BY TYPE DUE TO DEFECT OF SEMICONDUCTOR CHIPS

(75) Inventor: Jae-keun Lee, Chungcheongbuk-do (KR)

(73) Assignee: Isemicon, Inc., Taejon (KR)

( * ) Notice: Subject to any disclaimer, the term of this patent is extended or adjusted under 35 U.S.C. 154(b) by 0 days.

(21) Appl. No.: 09/743,262
(22) PCT Filed: Jul. 20, 1999
(86) PCT No.: PCT/KR99/00383
§ 371 (c)(1), (2), (4) Date: Jan. 8, 2001
(87) PCT Pub. No.: WO00/05759
PCT Pub. Date: Feb. 3, 2000

(30) Foreign Application Priority Data

Jul. 20, 1998 (KR) .......................................... 98-29089

(51) Int. Cl.$^7$ .............................................. H01L 21/66
(52) U.S. Cl. ....................................................... 702/84
(58) Field of Search ........................... 702/84, 185, 81; 382/145, 149, 172; 438/16, 14; 137/15; 700/121; 706/15

(56) References Cited

U.S. PATENT DOCUMENTS 5,665,609 A    9/1997   Mori
5,787,190 A    7/1998   Peng et al.

FOREIGN PATENT DOCUMENTS

JP    06-310581 A    11/1994

OTHER PUBLICATIONS

Evans, W. et al., "Partitioning Yield Loss via Test Pattern Structures and Critical Areas", *IEEE/SEMI Advanced Semiconductor Manufacturing Conference*, cat. No. 95CH35811, 1995, pp. 167–169, *IEEE*, New York, NY, USA.

Hansen, C. K., et al., "Use of Wafer Maps in Integrated Circuit Manufacturing", *Microelectronics Reliability*, Jun. 1998, pp. 1155–1164, vol. 38, No. 6–8, Elsevier Science Ltd.

Mill–Jer, W., et al, "Yield Improvement by Test Error Cancellation", *IEEE Proceeding of the Fifth Asian Test Symposium*, cat. No. 96BT100072, 1996, pp. 258–262, *IEEE*, Los Alamitos, CA, USA.

Zhang, D. et al., "Extraction and Utilization of Process Information from Si Wafer Maps", *Research & Process of SSE*, May 1995, pp. 180–184, vol. 15, No. 2.

Primary Examiner—John Barlow
Assistant Examiner—Tung Lau
(74) Attorney, Agent, or Firm—Rothwell, Figg, Ernst & Manbeck

(57) ABSTRACT

A method for measuring the number of yield loss chips and the number of poor chips by type due to defects of semiconductor chips by which it is possible to remarkably improve the yield of semiconductor chips by measuring the number of yield loss chips due to defects of the chips, the maximum number of yield loss chips, and the number of the specific type of poor chips in an arbitrary process, an arbitrary equipment, and an arbitrary process section among semiconductor fabrication processes, thus managing the defects of the chips, is provided.

The method for measuring the number of yield loss chips and the number of poor chips by type due to defects of semiconductor chips includes the steps of checking defective chips among effective chips on a wafer which underwent a predetermined process using a defect examination equipment and plotting the checked defective chips on a first wafer map, forming disparity chips by pairing defective chips and non-defective chips adjacent to the defective chips on the first wafer map and determining a maximum reliability region formed of regions in which the disparity chips are located, plotting good chips and poor chips by type on a second wafer map using a yield measuring apparatus after completing the process, and classifying the number of good chips and poor chips by type on the second wafer map corresponding to the defective chips and the non-defective chips in the maximum reliability region on the first wafer map.

8 Claims, 6 Drawing Sheets

A : GOOD CHIPS
B,C,D,E,F : POOR CHIPS BY TYPE

METHOD FOR MEASURING NUMBER OF YIELD LOSS CHIPS AND NUMBER OF POOR CHIPS BY TYPE DUE TO DEFECT OF SEMICONDUCTOR CHIPS

TECHNICAL FIELD

The present invention relates to a method for measuring an accurate value of yield loss due to chip defect caused by the inflow of dust or foreign material or due to poor shapes of chips during semiconductor manufacturing processes.

BACKGROUND ART

Defects of wafer chips caused by dust, foreign material, and poor shapes of the chips during semiconductor manufacturing processes critically affect the yield and characteristics of chips. Such a defect is generated in all handling processes including environment as well as all equipments and all semiconductor manufacturing processes. Thus, this makes the range of management of defects required by field managers very broad. Accordingly, production and quality management of chips is difficult.

Defects of chips critically affect the yield loss and characteristics of the chips. The yield loss is generally 1 through 30% of defective chips. Namely, the degree of yield loss varies according to processes with respect to the same numbers of defective chips. The degree of the yield loss varies according to products. The degree of the yield loss varies according to the degree and type of defects.

For example, in the case of a dynamic random access memory (DRAM), a poor chip is obtained when a defect exists outside a memory cell region. However, when a defect exists inside the memory cell region, a good chip can be obtained by performing a laser repair using a redundancy cell. Namely, the degree of yield loss varies in the same chip according to the positions of the defect.

Since the causes of yield loss during the fabrication of the semiconductor chips are derived from all processes such as a photolithography process, an etching process, a diffusion process, an ion implantation process, and a thin film deposition process as well as the above defects, it is difficult to determine how much effect defects have on yield loss.

It is difficult to manage yield by managing defects since the degree of yield loss varies according to products when defects are generated, the degree of the yield loss varies according to processes with respect to the same product, and defects are generated in all processes, equipments, circumstances, and handling processes of a semiconductor fabrication field.

It is possible to measure the total number of defects generated on a wafer, the total number of defective chips by the degree and type of defects with current technology of measuring yield loss and characteristics of the chip according to the defects. It is possible to analyze and measure the amount of yield loss to the total number of defects, the number of specific poor chips to the total number of defects, the yield loss amount to the total number of defective chips, and the number of specific poor chips to the total number of defective chips by matching the measurement result to the yield measurement result and statistically processing the result.

Accordingly, when the total number of defects or the total number of defective chips increases, the yield loss amount and specific defect ratio also increase. Namely, it is possible to relatively measure the amount of yield loss to the total number of defects, the number of specific poor chips to the total number of defects, the yield loss amount to the total number of defective chips, and the number of specific poor chips to the total number of defective chips.

As mentioned above, since the causes of yield loss exist in all processes, it is not possible to measure the absolute value of the yield loss by which it is possible to determine how much the chips in which the yield loss occurs are affected by the defect.

DISCLOSURE OF THE INVENTION

It is a first object of the present invention to provide a method for measuring the number of yield loss chips and the number of poor chips by type due to the defects of semiconductor chips by which it is possible to remarkably improve the yield of semiconductor chips by accurately obtaining the number of the yield loss chips due to defects of the chips, the maximum number of yield loss chips, and the number of specific types of poor chips in an arbitrary process, an arbitrary equipment, and an arbitrary process section among semiconductor fabrication processes, thus managing the defects of the chips.

It is a second object of the present invention to provide a computer readable medium on which the above method realized as a program is recorded.

Accordingly, to achieve the first object, there is provided a method for measuring the number of yield loss chips and the number of poor chips by type due to defects of semiconductor chips, comprising the steps of checking defective chips among effective chips on a wafer which underwent a predetermined process using a defect examination equipment and plotting the checked defective chips on a first wafer map, forming disparity chips by pairing defective chips and non-defective chips adjacent to the defective chips on the first wafer map and determining a maximum reliability region formed of regions in which the disparity chips are located, plotting good chips and poor chips by type on a second wafer map using a yield measuring apparatus after completing the process, and classifying the number of good chips and poor chips by type on the second wafer map corresponding to the defective chips and the non-defective chips in the maximum reliability region on the first wafer map.

Accordingly, to achieve the second object, there is provided a computer readable medium including program commands for measuring the number of the yield loss chips and the number of poor chips by type due to the defect of semiconductor chips, the computer readable medium comprising a computer readable code for inputting data on defective chips and non-defective chips among effective chips on a wafer which underwent a predetermined process from a defect examination equipment and plotting the input data on the defective chips and the non-defective chips on a first wafer map, a computer readable code for forming disparity chips by pairing the defective chips and the non-defective chips adjacent to the defective chips on the first wafer map and determining the maximum reliability region comprised of regions in which the disparity chips are located, a computer readable code for inputting data on good chips and poor chips by type from a yield measuring apparatus and plotting the input data on the good chips and the poor chips on a second wafer map, and a computer readable code for classifying the number of the good chips and the poor chips by type on the second wafer map corresponding to the defective chips and the non-defective chips in the maximum reliability region on the first wafer map and mapping out the statistics with respect to the yield loss and the number of the poor chips by type.

BRIEF DESCRIPTION OF THE DRAWINGS

The above objects and advantages of the present invention will become more apparent by describing in detail a preferred embodiment thereof with reference to the attached drawings in which.

BEST MODE FOR CARRYING OUT THE INVENTION

Hereinafter, an embodiment of the present invention will be described in detail with reference to the attached drawings.

Figure 1:
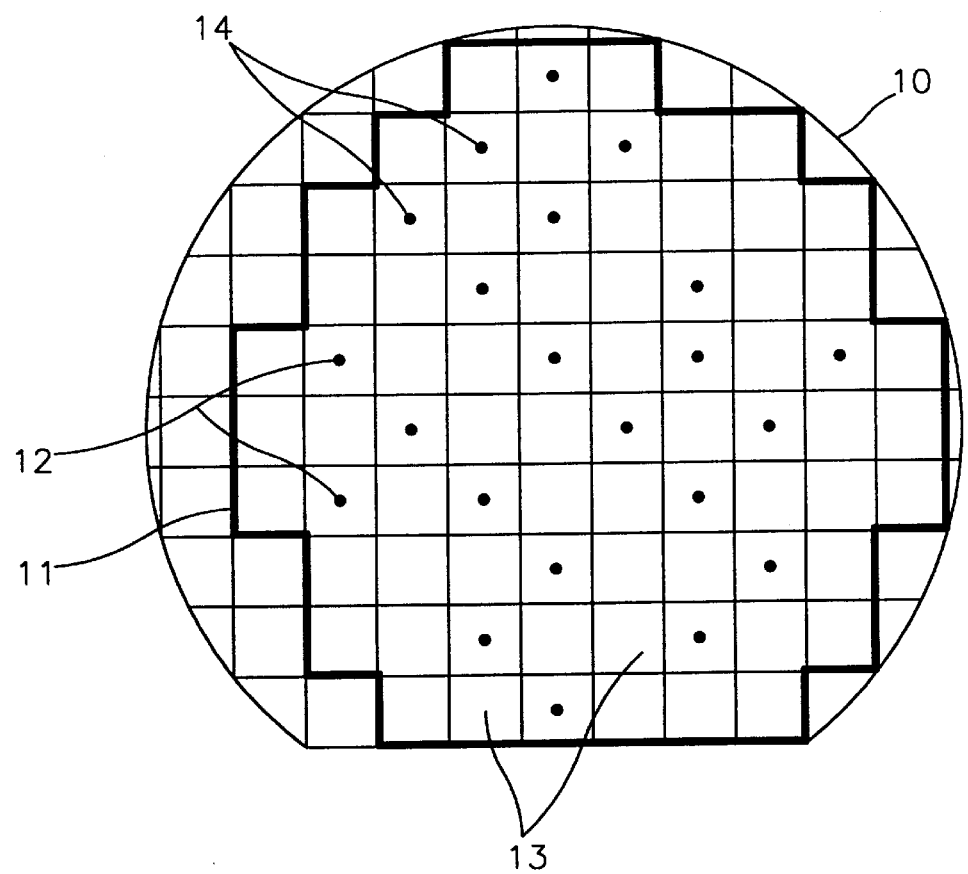
FIG. 1 shows a wafer map on which defective chips among effective chips are plotted on a wafer using a defect examination equipment according to the present invention.

In an embodiment of the present invention, in the first step, defective chips among effective chips on a wafer are plotted on a first wafer map using a defect examination equipment as shown in FIG. 1. FIG. 1 shows a first wafer map on which an effective chip region 11 comprised of 77 chips is constituted of twenty-two (22) defective chips 12 having defects 14 and fifty-five (55) non-defective chips 13 on a wafer 10.

Figure 2:
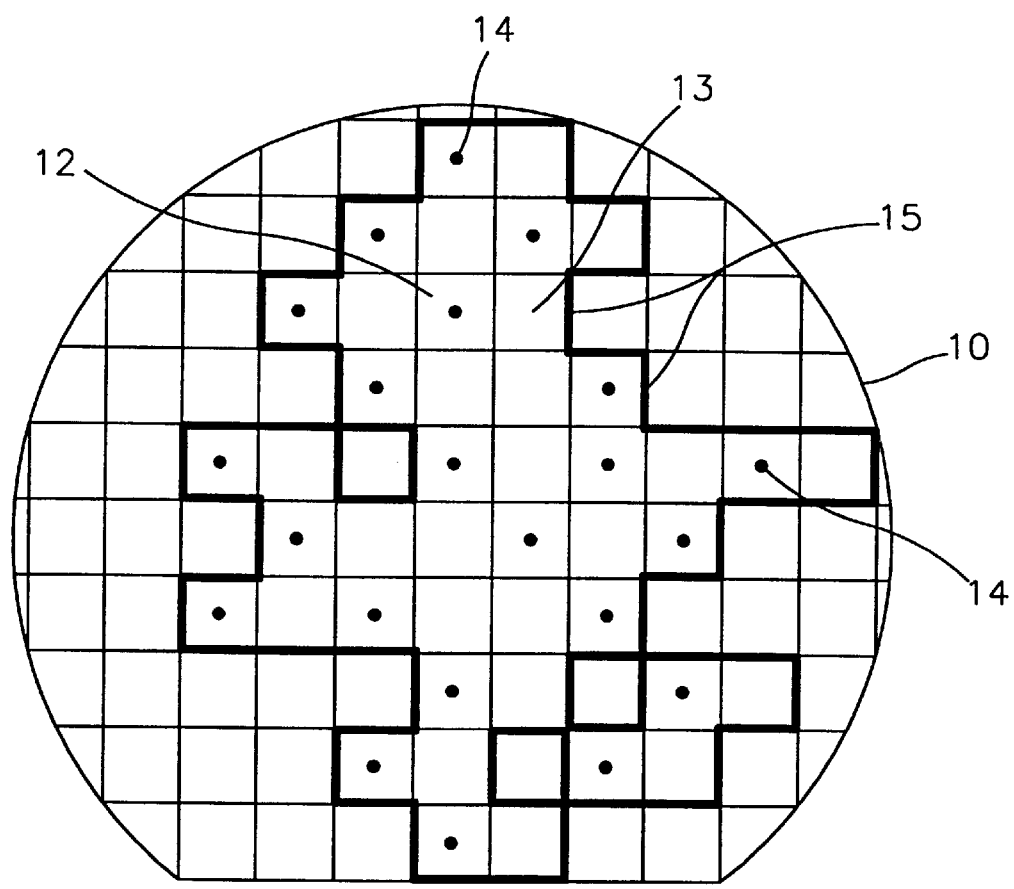
FIG. 2 shows a wafer map on which disparity chips are formed based on a defective chip pattern according to the present invention.

In the second step referred to by FIG. 2, a disparity chip 15 is formed on the first wafer map by pairing each defective chip 12 confirmed in the first step and each non-defective chip 13 adjacent thereto.

Figure 3:
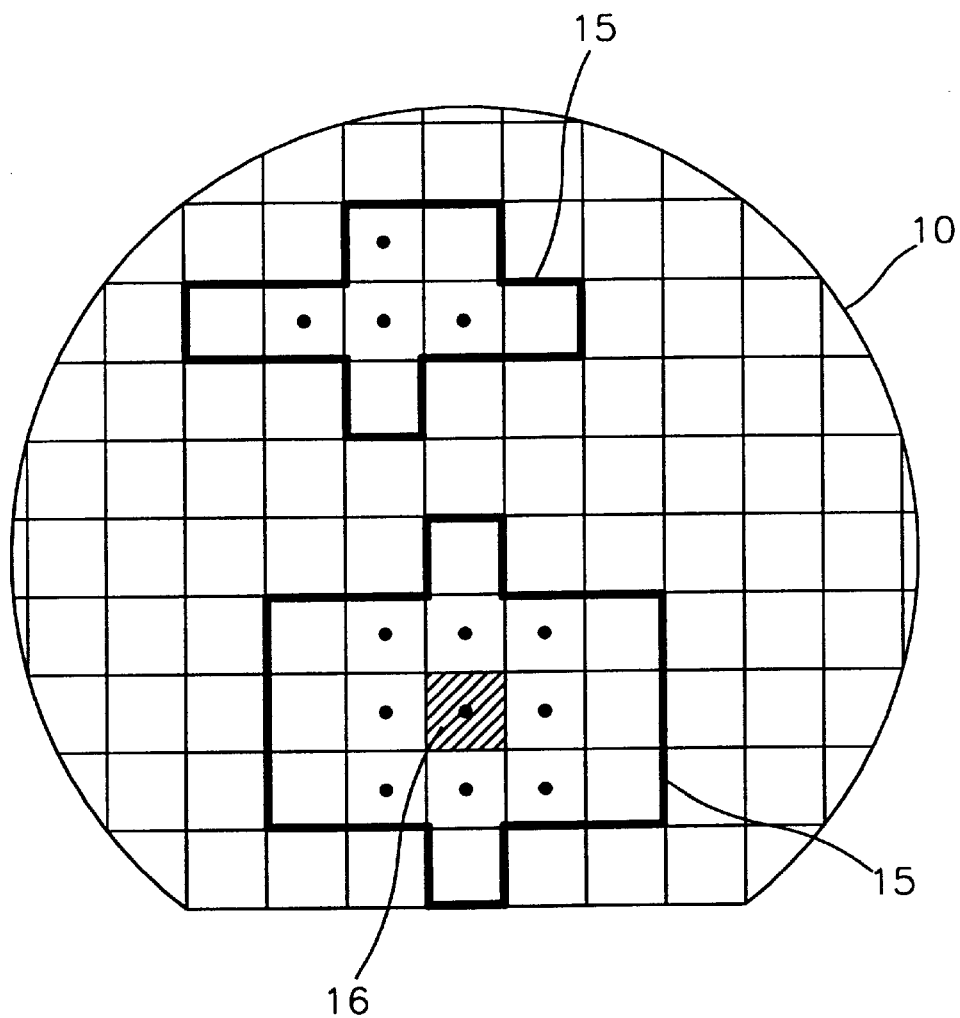
FIG. 3 explains a method of constituting the disparity chips according to the present invention.

In FIG. 3, a disparity chip is formed by sequentially searching for defective chips on the wafer map and combining the defective chips with non-defective chips directly above, below, to the left and right among the non-defective chips which did not form the disparity chip 15. Since the defective chips are collectively generated, the defective chips which do not form the disparity chip 15, that is, a non-disparity chip 16 can deteriorate reliability. Therefore, the non-disparity chip 16 is excluded from data which form the reliability region for generating statistics according to the present invention.

Figure 4:
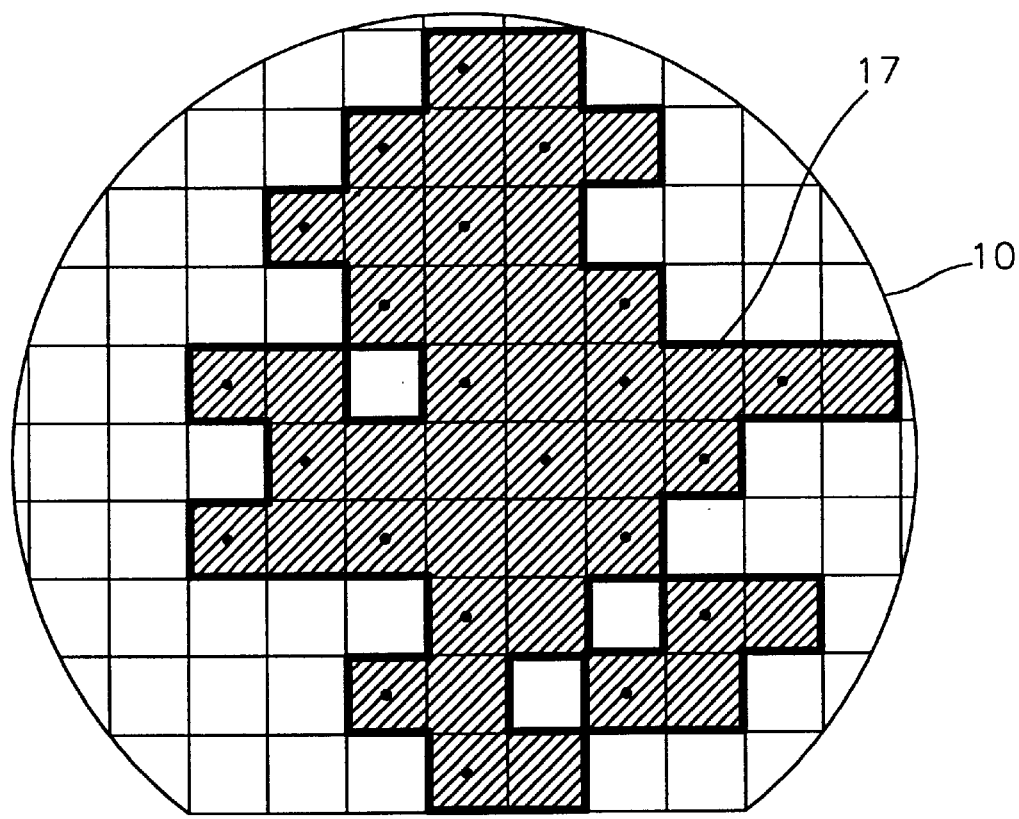
FIG. 4 shows a wafer map on which a maximum reliability region fixed by the combination of disparity chips according to the present invention is displayed.

In the third step, referring to FIG. 4, a maximum reliability region 17 formed by combining the disparity chips formed in the second step is fixed on the first wafer map.

Figure 5:
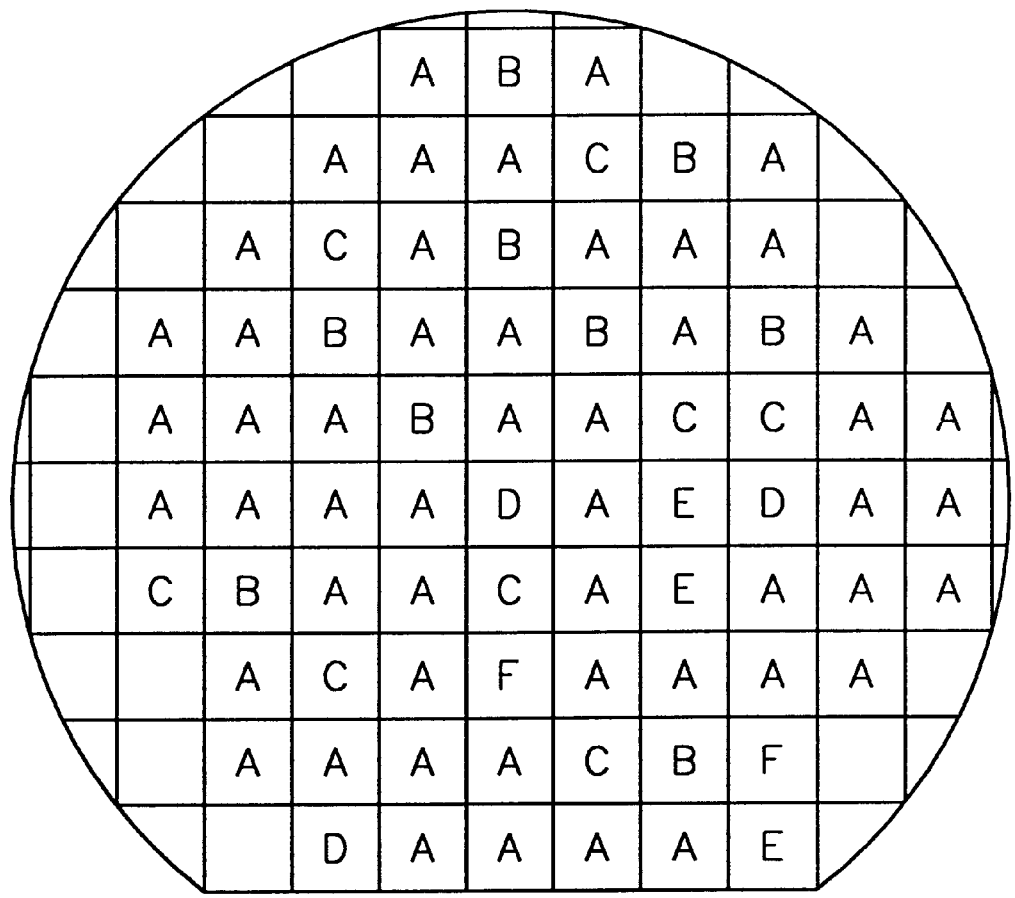
FIG. 5 shows a wafer map on which effective chips on a wafer are classified into good chips and poor chips using a yield measuring apparatus according to the present invention.

In the fourth step, referring to FIG. 5, good chips A and poor chips B, C, D, E, and F are plotted on the second wafer map using the yield measuring apparatus. FIG. 5 shows the second wafer map on which good chips and poor chips are plotted.

Figure 6:
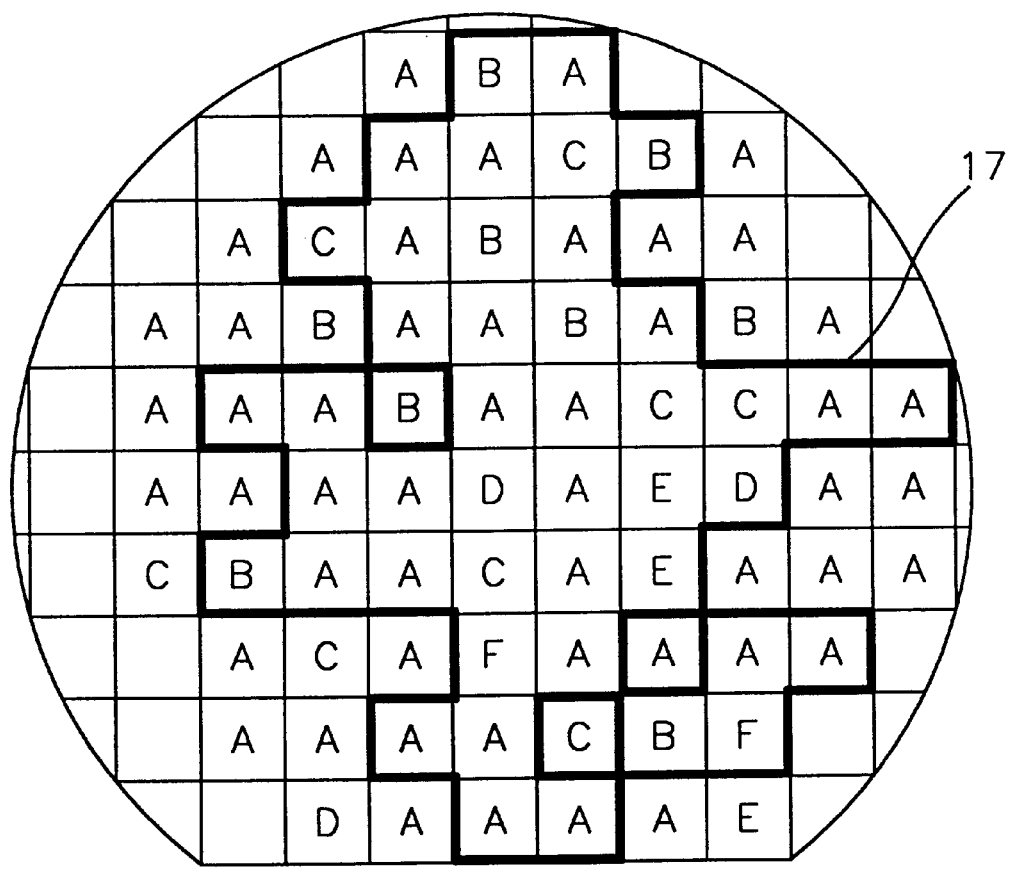
FIG. 6 shows a wafer map on which good chips and poor chips by type in the maximum reliability region according to the present invention are extracted.

In the fifth step, referring to FIG. 6, good chips A and poor chips B, C, D, E, and F on the second wafer map, resulting from the measurement of the yield in the fourth step are extracted from the maximum reliability region on the first wafer map.

In the sixth step, as shown in Table 1, all the disparity chips in the maximum reliability region are classified into defective chips and non-defective chips. The classified defective chips and non-defective chips are respectively classified into good chips, poor chips, and inferiority types.

TABLE 1

|  | Number of good chips | Number of poor chips | Total | Inferiority types | | | | |
|---|---|---|---|---|---|---|---|---|
|  |  |  |  | B | C | D | E | F |
| Defective chips | 12 | 10 | 22 | 4 | 3 | 1 | 1 | 1 |
| Non-defective chips | 15 | 7 | 22 | 2 | 2 | 1 | 1 | 1 |

In the seventh step, the generation ratios of the good chips and the poor chips to the defective chips and the generation ratios according to inferiority types and generation ratio of good chips and poor chips to non-defective chips and the generation ratios according to inferiority types are calculated as follows.

Defective chips:
  The generation ratio of good chips: 12/22=0.545 (a)
  The generation ratio of poor chips: 10/22=0.455 (b)
  The generation ratio of B type inferiority: 4/22=0.182 (c)
  The generation ratio of C type inferiority: 3/22=0.136 (d)
  The generation ratio of D type inferiority: 1/22=0.045 (e)
  The generation ratio of E type inferiority: 1/22=0.045 (f)
  The generation ratio of F type inferiority: 1/22=0.045 (g)
Non-defective chips:
  The generation ratio of good chips: 15/22=0.682 (h)
  The generation ratio of poor chips: 7/22=0.318 (i)
  The generation ratio of B type inferiority: 2/22=0.091 (j)
  The generation ratio of C type inferiority: 2/22=0.091 (k)
  The generation ratio of D type inferiority: 1/22=0.045 (l)
  The generation ratio of E type inferiority: 1/22=0.045 (m)
  The generation ratio of F type inferiority: 1/22=0.045 (n).

In step 8, the sum of yield losses according to the current level, the optimal level, and the worst level is calculated by the process provided in Table 2 using the various generation ratios calculated in the step 7.

TABLE 2

|  | Total number of chips | Number of non-defective chips Number of defective chips | Yield loss of non-defective chips Yield loss of defective chips | Sum of yield losses |
|---|---|---|---|---|
| Current level | 77 | 55 | 17.49 (55 × 0.318) | 27.5 (o) |
|  |  | 22 | 10.01 (22 × 0.455) |  |
| Optimal level | 77 | 77 | 24.49 (77 × 0.318) | 24.49 (p) |
|  |  | 0 | 0 (0 × 0.455) |  |
| Worst level | 77 | 0 | 0 (0 × 0.318) | 35.04 (q) |
|  |  | 77 | 35.04 (77 × 0.455) |  |

Current level refers to a state in which there are fifty-five (55) non-defective chips and twenty-two (22) defective chips. Optimal level refers to a state in which all chips are non-defective chips. Worst level refers to a state in which all chips are defective chips.

In the ninth step, the number of yield loss chips according to defects and the maximum number of yield loss chips are calculated as follows based on the sum of yield losses obtained in step 8.

The number of yield loss chips due to defects=the current level value (o)–the optimal level value (p)=27.5–24.49=3.01 chips.

The maximum number of yield loss chips=the worst level value (q)–the optimal level value (p)=35.04–24.49=10.55 chips.

Here, in the current level (the total number of chips: 77 and the number of the defective chips : 22), the yield loss (3.01/77=3.91%) of the 3.01 chips is generated due to the defects. A maximum yield loss (10.55/77=13.7%) of 10.55 chips may be generated by the defects.

It is possible to produce processes of inferiority generation of the current level, the optimal level, and the worst level according to the inferiority type from the various generation ratios calculated in the seventh step. The total number of B-type poor chips according to the current level, the optimal level, and the worst level in the inferiority type B are calculated by the processes provided in Table 3.

TABLE 3

|  | Total number of chips | Number of non-defective chips Number of defective chips | Number of B type poor chips of non-defective chips Number of B type poor chips of defective chips | Total number of B type poor chips |
|---|---|---|---|---|
| Current level | 77 | 55 | 5.01 (55 × 0.091) | 9.01 (o) |
|  |  | 22 | 4.00 (22 × 0.182) |  |
| Optimal level | 77 | 77 | 7.01 (77 × 0.091) | 7.01 (p) |
|  |  | 0 | 0 (0 × 0.182) |  |
| Worst level | 77 | 0 | 0 (0 × 0.091) | 14.01 (q) |
|  |  | 77 | 14.01 (77 × 0.182) |  |

It is possible to obtain the generation ratio of B-type inferiority and the maximum generation ratio of B-type inferiority.

The number of chips in which B-type specific inferiority is generated due to defects=the current level value (r)—the optimal level value (s)=9.01–7.01=2 chips.

The maximum number of chips in which the B type specific inferiority may be generated=the worst level value (t)—the optimal level value (s)=14.01–7.01=7 chips.

It is noted from the above that the B-type of inferiority (2/77=2.60%) is generated in two chips due to the defects in the current level (the total number of chips: 77 and the number of the defective chips: 22) and that the B-type of inferiority (7177=9.09%) may be generated in a maximum of 7 chips due to the defects.

Also, the total number of C-type poor chips according to the current level, the optimal level, and the worst level in the C type inferiority type can be calculated by the processes provided in Table 4.

TABLE 4

|  | Total number of chips | Number of non-defective chips Number of defective chips | Number of C type poor chips of non-defective chips Number of C type poor chips of defective chips | Total number of C type poor chips |
|---|---|---|---|---|
| Current level | 77 | 55 | 5.01 (55 × 0.091) | 8.00 (u) |
|  |  | 22 | 2.99 (22 × 0.136) |  |
| Optimal level | 77 | 77 | 7.01 (77 × 0.091) | 7.01 (v) |
|  |  | 0 | 0 (0 × 0.136) |  |
| Worst level | 77 | 0 | 0 (0 × 0.091) | 10.47 (w) |
|  |  | 77 | 10.47 (77 × 0.136) |  |

It is possible to obtain the generation ratio of C-type inferiority and the maximum generation ratio of C-type inferiority.

The number of chips in which C-type inferiority is generated due to defects=the current level value (u)—the optimal level value (v)=8.00–7.01=0.99 chips.

The maximum number of chips in which C-type inferiority may be generated=the worst level value (w)—the optimal level value (v)=10.47–7.01=3.46 chips.

It is noted from the above that the C-type of inferiority (0.99/77=1.29%) is generated in 0.99 chips due to the defects in the current level (the total number of chips: 77 and the number of the defective chips: 22) and that the C-type of inferiority (3.46/77=4.49%) may be generated in a maximum of 3.46 chips due to the defects.

Also, it is possible to obtain the inferiority generation ratio and the maximum inferiority generation ratio by the same method as used in the B-type and C-type of inferiority.

The above-mentioned embodiment can be made out as a program which can be executed by computers. The embodiment can be realized by general purpose digital computers which operate program from a computer readable medium. The computer readable medium may include a magnetic storing medium such as a ROM, a floppy disk, and a hard disk, an optical reading medium such as a CD-ROM and a DVD, and carrier waves, for example, transmission through the Internet.

Functional programs, codes, and code segments for realizing the present invention can be easily referred to by programmers in the art.

Industrial Applicability

As mentioned above, according to the present invention, it is possible to accurately measure the absolute values of the yield loss and the specific inferiority types due to the defects by clarifying the yield loss process after completely removing the influences of other process elements than the defects through a maximum reliability region design method constituted of only the disparity chip. Therefore, it is possible to accurately check the yield loss due to defects with respect to a unit process, a unit equipment, and a unit process section on the basis of the absolute values. Accordingly, it is possible to set the management order of priority and the management level with respect to critical processes, critical equipment, and critical process sections by correct numbers, to thus reasonably manage defects. Accordingly, it is possible to improve yield.

What is claimed is:

1. A method for measuring the number of yield loss chips and the number of poor chips by type due to defects of semiconductor chips, comprising the steps of:
   (a) checking defective chips among effective chips on a wafer which underwent a predetermined process using a defect examination equipment and plotting the checked defective chips on a first wafer map;
   (b) forming disparity chips by pairing defective chips and non-defective chips adjacent to the defective chips on the first wafer map and determining a maximum reliability region formed of regions in which the disparity chips are located;
   (c) plotting good chips and poor chips by type on a second wafer map using a yield measuring apparatus after completing the process; and
   (d) classifying the number of good chips and poor chips by type on the second wafer map corresponding to the defective chips and the non-defective chips in the maximum reliability region on the first wafer map, wherein, in the step (b), disparity chips are formed by sequentially searching defective chips on a wafer map and by combining the defective chip searched among non-defective chips which did not form a disparity chip with non-defective chips directly above, below, to the left and right and the defective chips which are not combined with the adjacent non-defective chips among the searched defective chips are excluded from the maximum reliability region.

2. A method for measuring the number of yield loss chips and the number of poor chips by type due to defects of semiconductor chips, comprising the steps of:
   (a) checking defective chips among effective chips on a wafer which underwent a predetermined process using a defect examination equipment and plotting the checked defective chips on a first wafer map;
   (b) forming disparity chips by pairing defective chips and non-defective chips adjacent to the defective chips on the first wafer map and determining a maximum reliability region formed of regions in which the disparity chips are located;
   (c) plotting good chips and poor chips by type on a second wafer map using a yield measuring apparatus after completing the process; and
   (d) classifying the number of good chips and poor chips by type on the second wafer map corresponding to the defective chips and the non-defective chips in the maximum reliability region on the first wafer map, wherein the step (d) comprises the steps of:
      (d1) classifying the number of good chips and poor chips on a second wafer map, corresponding to defective chips and non-defective chips in the maximum reliability region on a first wafer map; and
      (d2) obtaining the generation ratio of poor chips and inferiority generation ratio by type to the defective chips and the generation ratio of the poor chips and the inferiority generation ratio by type to the non-defective chips based on the number of good chips and poor chips by type classified in the step (d1).

3. The method of claim 2, wherein the step (d) further comprises the step of (d3) obtaining the sum of the yield loss according to a current level, an optimal level, and a worst level and the total number of poor chips by type, based on the generation ratio of poor chips and inferiority generation ratio by type to the defective chips and the generation ratio of the poor chips and the inferiority generation ratio by type to the non-defective chips.

4. The method of claim 3, wherein the step (d) further comprises the step of (d4) obtaining the number of yield loss chips, the maximum number of yield loss chips, and the ratio of the maximum number of yield loss chips to the number of yield loss chips and the number of chips in which inferiority is generated by type, the maximum number of chips in which inferiority may be generated, and the ratio of the maximum number of chips in which inferiority may be generated to the number of chips in which inferiority is generated by type.

5. A method for measuring the number of yield loss chips and the number of poor chips by type due to defects of semiconductor chips, comprising the steps of:
   (a) checking defective chips among effective chips on a wafer which underwent a predetermined process using a defect examination equipment and plotting the checked defective chips on a first wafer map;
   (b) forming disparity chips by pairing defective chips and non-defective chips adjacent to the defective chips on the first wafer map and determining a maximum reliability region formed of regions in which the disparity chips are located;
   (c) plotting good chips and poor chips by type on a second wafer map using a yield measuring apparatus after completing the process;
   (d) classifying the number of good chips and poor chips by type on the second wafer map corresponding to the defective chips and the non-defective chips in the maximum reliability region on the first wafer map; and
   (e) obtaining the generation ratio of poor chips and inferiority generation ratio by type to the defective chips and the generation ratio of the poor chips and the inferiority generation ratio by type to the non-defective chips based on the number of good chips and poor chips by type classified in the step (d).

6. The method of claim 5 wherein, in the step (b), disparity chips are formed by sequentially searching defective chips on a wafer map and by combining the defective chip searched among non-defective chips which did not form a disparity chip with non-defective chips directly above, below, to the left and right and the defective chips which are not combined with the adjacent non-defective chips among the searched defective chips are excluded from the maximum reliability region.

7. The method of claim 5 further comprising the step of:
   (f) obtaining the sum of the yield loss according to a current level, an optimal level, and a worst level and the total number of poor chips by type, based on the generation ratio of poor chips and inferiority generation ratio by type to the defective chips and the generation ratio of the poor chips and the inferiority generation ratio by type to the non-defective chips.

8. The method of claim 7 further comprising the step of:
   (g) obtaining the number of yield loss chips, the maximum number of yield loss chips, and the ratio of the maximum number of yield loss chips to the number of yield loss chips and the number of chips in which inferiority is generated by type, the maximum number of chips in which inferiority may be generated, and the ratio of the maximum number of chips in which inferiority may be generated to the number of chips in which inferiority is generated by type.

* * * * *